US008576607B1

(12) United States Patent
Nemati

(10) Patent No.: US 8,576,607 B1
(45) Date of Patent: Nov. 5, 2013

(54) HYBRID MEMORY CELL ARRAY AND OPERATIONS THEREOF

(76) Inventor: Farid Nemati, Redwood City, CA (US)

( * ) Notice: Subject to any disclaimer, the term of this patent is extended or adjusted under 35 U.S.C. 154(b) by 159 days.

(21) Appl. No.: 13/172,702

(22) Filed: Jun. 29, 2011

Related U.S. Application Data

(60) Provisional application No. 61/361,367, filed on Jul. 2, 2010.

(51) Int. Cl.
*G11C 11/00* (2006.01)

(52) U.S. Cl.
USPC ....... 365/148; 365/105; 365/180; 365/185.08

(58) Field of Classification Search
USPC ............................ 365/148, 105, 180, 185.08
See application file for complete search history.

(56) References Cited

U.S. PATENT DOCUMENTS 6,611,452 B1 8/2003 Han
6,721,220 B2 4/2004 Yoon
6,734,815 B1 5/2004 Abdollahi-Alibeik
6,735,113 B2 5/2004 Yoon
6,756,838 B1 6/2004 Wu
6,778,435 B1 8/2004 Han
6,781,888 B1 8/2004 Horch
6,785,169 B1 8/2004 Nemati
6,804,162 B1 10/2004 Eldridge
6,885,581 B2 4/2005 Nemati
6,891,774 B1 5/2005 Abdollahi-Alibeik
6,903,987 B2 6/2005 Yoon
6,937,085 B1 8/2005 Samaddar
6,940,772 B1 9/2005 Horch
6,944,051 B1 9/2005 Lee
6,947,349 B1 9/2005 Abdollahi-Alibeik
6,958,931 B1 10/2005 Yoon
6,980,457 B1 * 12/2005 Horch et al. .................. 365/105
7,042,759 B2 5/2006 Nemati
7,053,423 B1 * 5/2006 Nemati et al. ................ 257/107
7,054,191 B1 5/2006 Gupta
7,078,739 B1 7/2006 Nemati
7,089,439 B1 8/2006 Abdollahi-Alibeik
7,096,144 B1 8/2006 Bateman
7,130,216 B2 * 10/2006 Bhattacharyya ......... 365/185.08
7,187,530 B2 3/2007 Salling
7,268,373 B1 9/2007 Gupta
7,304,327 B1 12/2007 Nemati
7,319,622 B1 1/2008 Roy
7,379,381 B1 5/2008 Roy
7,405,963 B2 7/2008 Nemati
7,460,395 B1 12/2008 Cho
7,464,282 B1 12/2008 Abdollahi-Alibeik
7,573,077 B1 8/2009 Ershov
7,587,643 B1 9/2009 Chopra
7,619,917 B2 * 11/2009 Nirschl et al. ................ 365/180

(Continued)

OTHER PUBLICATIONS

U.S. Appl. No. 12/501,995, filed Jul. 13, 2009, Chopra.

(Continued)

*Primary Examiner* — Viet Q Nguyen
(74) *Attorney, Agent, or Firm* — The Webostad Firm

(57) ABSTRACT

An integrated circuit and methods of operating same are described. In an embodiment of the integrated circuit included is an array of memory cells, where each of the memory cells includes a resistance-change storage element and a thyristor-based storage element coupled in series. In embodiments of the methods included are methods for data transfer, data tracking, and operating a memory array.

6 Claims, 12 Drawing Sheets

700 providing hybrid memory cells of a memory array
701 writing first data states of phase-change storage elements of the hybrid memory cells to corresponding thyristor-based storage elements of the hybrid memory cells
702 operating the memory array using the thyristor-based storage elements as volatile dynamic random access memory
703 reading second data states of the thyristor-based storage elements
704 writing the second data states to the phase-change storage elements using the thyristor-based storage elements as access devices
705 powering down the memory array
706

(56) References Cited

U.S. PATENT DOCUMENTS

| | | | | |
|---|---|---|---|---|
| 7,738,274 | B1 | 6/2010 | Nemati | |
| 8,208,294 | B2 * | 6/2012 | Happ et al. | 365/163 |
| 8,288,795 | B2 * | 10/2012 | Tang | 257/107 |
| 8,385,100 | B2 * | 2/2013 | Kau et al. | 365/148 |
| 2010/0044669 | A1 * | 2/2010 | Happ et al. | 257/3 |
| 2010/0293350 | A1 * | 11/2010 | Happ et al. | 711/162 |
| 2012/0241708 | A1 * | 9/2012 | Widjaja | 257/2 |
| 2013/0037879 | A1 * | 2/2013 | Filippini et al. | 257/330 |

OTHER PUBLICATIONS

MICRON, DDR3 SDRAM, 2006, Micron Technology, Boise, Id.

Bez, Chalcogenide PCM: A Memory Technology for Next Decade, Numonyx, R&D Technology Development, Via C. Olivetti 2, 20041, Agrate Brianza, IEEE, Jun. 2009, 5.1.1-5.1.4, Milan, Italy.

Servalli, A 45nm Generation Phase Change Memory Technology, Numonyx, R&D Technology Development, Via C. Olivetti 2, 20041 Agrate Brianza, IEEE, Jun. 2009, 5.7.1-5.7.4, Milan, Italy.

* cited by examiner

HYBRID MEMORY CELL ARRAY AND OPERATIONS THEREOF

FIELD

One or more aspects generally relate to integrated circuit devices. More particularly, one or more aspects generally relate to a hybrid memory cell array and operations associated therewith.

BACKGROUND

Semiconductor memories such as static random access memory ("SRAM") and dynamic random access memory ("DRAM") are in widespread use. DRAM is very common due to its high density with a cell size typically between $6F^2$ and $8F^2$, where F is a minimum feature size. However, DRAM is relatively slow, having an access time commonly near 20 nanoseconds ("ns"). Although SRAM access time is typically an order of magnitude faster than DRAM, an SRAM cell is commonly made of four transistors and two resistors or of six transistors, thus leading to a cell size of approximately $60F^2$ to $100F^2$.

Others have introduced memory designs based on a negative differential resistance ("NDR") cell, such as a thyristor-base memory cell, to minimize the size of a conventional SRAM memory. A thyristor-based random access memory ("RAM") may be effective in memory applications. Additional details regarding a thyristor-based memory cell are described in U.S. Pat. Nos. 6,891,205 B1 and 7,460,395 B1.

Charge leakage out of a thyristor-based memory cell negatively impacts the restore rate of such cell. Additional details regarding periodically pulsing a thyristor-based memory cell to restore or refresh state of such a cell may be found in Patent Cooperation Treaty ("PCT") International Publication WO 02/082504.

However, thyristor-based DRAM is volatile. In contrast, various types of "resistance-change memory" or Resistive RAM (RRAM) are non-volatile. A widely researched and developed resistance-change memory, called phase-change memory (PCM) is described in additional detail in "Chalcogenide PCM: a Memory Technology for Next Decade" by Roberto Bez, published by IEEE for IEDM 2009 at pages 89-92 (ISBN 97-4244-5640-6/09), and "A 45 nm Generation Phase Change Memory Technology" by G. Servalli, published by IEEE for IEDM 2009 at pages 113-116 (ISBN 97-4244-5640-6/09). Unfortunately, PCM and other types of RRAM conventionally do not have sufficient endurance to be used as DRAM.

Accordingly, it would be desirable and useful to provide an array that has benefits of both thyristor-based memory cells and PCM cells.

BRIEF SUMMARY

One or more aspects generally relate to a hybrid memory cell array and operations associated therewith.

An embodiment relates generally to an integrated circuit having an array of memory cells. In such an embodiment, each of the memory cells includes a resistance-change storage element and a thyristor-based storage element coupled in series.

Another embodiment relates generally to a method for data transfer. In such an embodiment, an array of memory cells is provided, where each of the memory cells includes a resistance-change storage element and a thyristor-based storage element coupled in series. A bitline is pulsed to a first write voltage level and a gate wordline is pulsed to a second write voltage level to access the thyristor-based storage element of a memory cell of the memory cells. The first write voltage level is below a threshold voltage level of the resistance-change storage element of the memory cell, where a data state stored in the resistance-change storage element of the memory cell is effectively transferred to the thyristor-based storage element of the memory cell.

Yet another embodiment relates generally to another method for data transfer. In such an embodiment, an array of memory cells is provided, where each of the memory cells includes a resistance-change storage element and a thyristor-based storage element coupled in series. The thyristor-based storage element of a memory cell of the memory cells is read to obtain a data state stored therein, and the data state is written to the resistance-change storage element of the memory cell using the thyristor-based storage element as the access device to the resistance-change storage element.

Still yet another embodiment relates generally to a method for data tracking. In such an embodiment, an array of memory cells is provided, where each of the memory cells includes a resistance-change storage element and a thyristor-based storage element coupled in series. Data states are effectively transferred from resistance-change storage elements of the memory cells to corresponding thyristor-based storage elements of the memory cells, and the transfer is tracked.

Still yet further another embodiment relates generally to a method for operating a memory array. In such an embodiment, hybrid memory cells of the memory array are provided, where the hybrid memory cells each have a resistance-change storage element and a thyristor-based storage element. Data states of resistance-change storage elements of the hybrid memory cells are written to corresponding thyristor-based storage elements of the hybrid memory cells, and the memory array is operated using the thyristor-based storage elements as volatile dynamic random access memory.

BRIEF DESCRIPTION OF THE DRAWING(S)

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 1A though 1D are a circuit diagrams depicting an exemplary embodiments of an integrated circuits with memory arrays.

DETAILED DESCRIPTION

Figure 1A:
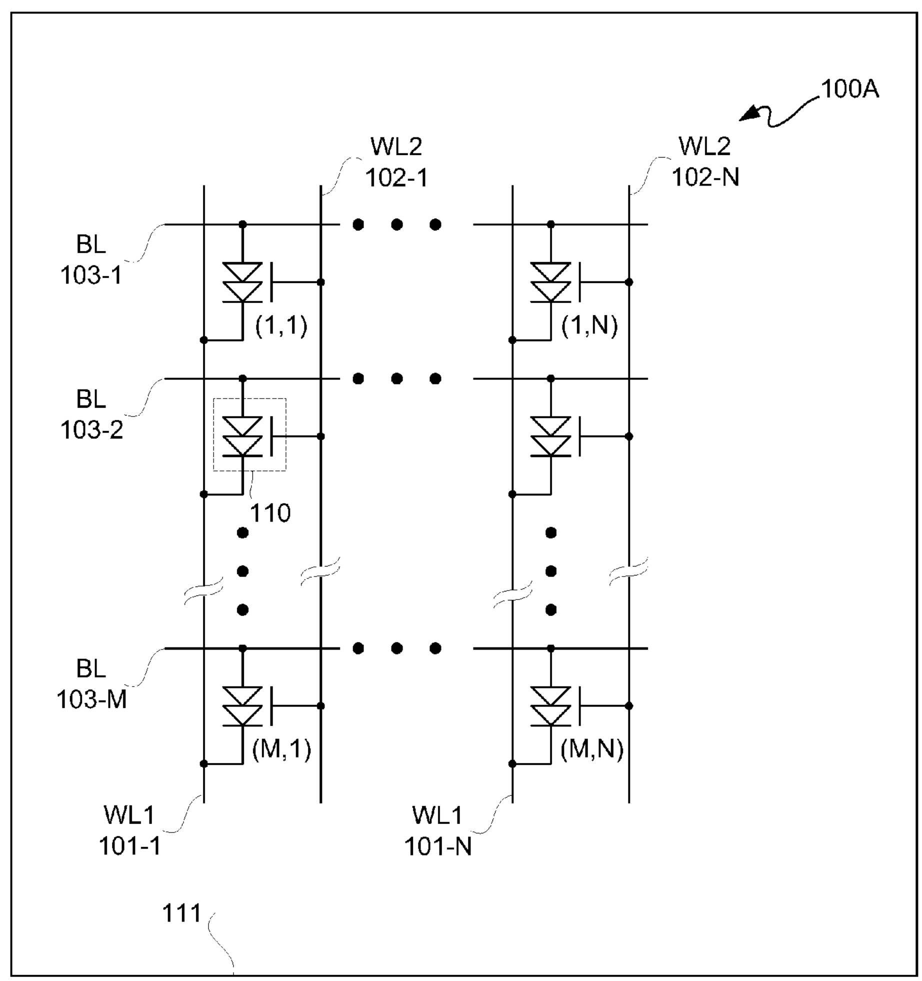

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in alternative embodiments the items may be different. Moreover, for purposes of clarity, a single signal or multiple signals may be referred to or illustratively shown as a signal to avoid encumbering the description with multiple signal lines. Moreover, along those same lines, a transistor, among other circuit elements, may be referred to or illustratively shown as a single transistor though such reference or illustration may be representing multiples thereof. Furthermore, though particular signals and voltages may be described herein for purposes of clarity by way of example, it should be understood that the scope of the description is not limited to these particular numerical examples as other values may be used.

Before a detailed description of exemplary embodiments, discussion of some terminology surrounding thyristor-based memory cells may be helpful. Voltage on a supply voltage line may be above both a logic low voltage reference level ("Vss" or "VSS") and a logic high voltage reference level ("Vdd" or "VDD"), and this supply voltage may be used as an anodic voltage for a thyristor-based memory cell. Accordingly, reference to this supply voltage includes its anodic use, and as such it is referred to herein as "VDDA" to clearly distinguish it from Vdd. Thyristor-based memory cells have an anode or anode emitter region, a cathode or cathode emitter region, a p-base or p-base region, and an n-base or n-base region.

Thyristor-based memory cells have an anode or anode emitter region, a cathode or cathode emitter region, a p-base or p-base region, and an n-base or n-base region. Each thyristor-based memory cell may optionally include an access device, which may be a field effect transistor ("FET"), for SRAM applications. However, the exemplary embodiments described below are for DRAM application, namely thyristor-based memory cells that do not have corresponding access devices as part of the cell. This is for purposes of clarity and not limitation, as it shall be understood that either or both DRAM and SRAM applications may be used.

Thyristor-based memory cells may have an equivalent circuit model, namely a storage element, cross coupled bi-polar junction transistors ("BJTs") and a capacitor. Such storage element may be a type of a device known as Thin Capacity Coupled Thyristor ("TCCT") device. Thus, sometimes thyristor-based memory cells are alternatively referred to as TCCT cells. If the main or "first" base is n-type, then such thyristor-based memory cells may be referred to as n-TCCT cells; or, if the main or "first" base is p-type, then such thyristor-based memory cells may be referred to as p-TCCT cells. The main or first base is principally capacitively coupled to a gate of the TCCT cell. A secondary or "second" base may be located adjacent to the first base. However, the "second" base likely will have a much smaller capacitive coupling to the gate. A gate dielectric, which may be one or more layers, separates the first base, and in some embodiments the second base, from the gate.

For each thyristor-based memory cell array, there is a first wordline ("WL1") associated with either emitter node of the cells of such array. A control gate of a storage element, which may generally be associated with a plate of a capacitor, may be formed with a second wordline ("WL2"). For convenience, WL2s are associated with columns, and WL1s are associated with columns or rows, as described below in additional detail. However, an opposite orientation of WL2s may be used provided such WL2s are generally perpendicular to bitlines.

The exact number of memory cells or bits associated with a WL1 or a WL2 may vary from application to application, and may vary between SRAM and DRAM applications. Some other details regarding thyristor-based memory cells, including silicides, extension regions, and spacers, among other details, may be found in U.S. Pat. Nos. 6,767,770 B1 and 6,690,039 B1.

FIG. 1A is a circuit diagram depicting an exemplary embodiment of an integrated circuit 111. Integrated circuit 111 includes a memory array 100A. Memory array 100A is coupled to memory array peripheral circuitry, which is not shown for purposes of clarity. Such peripheral circuitry may include decoders, drivers, and sense amplifiers. Integrated circuit 111 may be a host chip for memory array 100A, where the primary purpose of integrated circuit 111 is not as a memory device, namely an embedded memory array 100A. In another embodiment, integrated circuit 111 may be a memory chip in which memory array 100A is located.

Memory array 100A includes memory cells 110. Memory cells 110 are thyristor-based memory cells or TCCT cells. Memory cells 110 may be lateral cells or vertical cells, as described below in additional detail. In this exemplary embodiment, memory cells 110 are DRAM cells made of p-TCCTs. In other embodiments, an access device may be used with thyristor-based memory cells 110, which access device is not shown here for purposes of clarity.

In this exemplary embodiment of memory array 100A, there are M rows and N columns, where M and N are integers each of which is greater than one. Memory array 100A has first wordlines ("WL1") 101-1 through 101-N, second wordlines ("WL2") 102-1 through 102-N, and bitlines ("BL") 103-1 through 103-M. Accordingly, each cell may be designated by its row and column coordinates, namely (M, N) values.

Wordlines 102-1 through 102-N are coupled to or formed as part of gates of thyristor-based memory cells 110. More particularly, a wordline, such as wordline 102-1 for example, is coupled to gates of thyristor-based memory cells 110 of a first column of such cells of memory array 100A. Moreover, in this exemplary embodiment, wordlines 101-1 through 101-N and 102-1 through 102-N, are associated with columns, and bitlines, such as bitlines 103-1 through 103-M are associated with rows.

Bitlines 103-1 through 103-M may be coupled to either anode or cathode emitters of memory cells 110. In this exemplary embodiment, bitlines 103-1 through 103-M are coupled to anodes. More particularly, a row of memory cells 110, namely memory cells (1, 1) to (1, N) may all be coupled to bitline 103-1 at respective anodes of such memory cells. Wordlines 101-1 through 101-N may be coupled to columns of memory cells 110, respectively, at cathodes of such memory cells. More particularly, memory cells (1, 1) to (M, 1) may each have their associated cathode nodes coupled to wordline 101-1 for example.

Figure 1B:
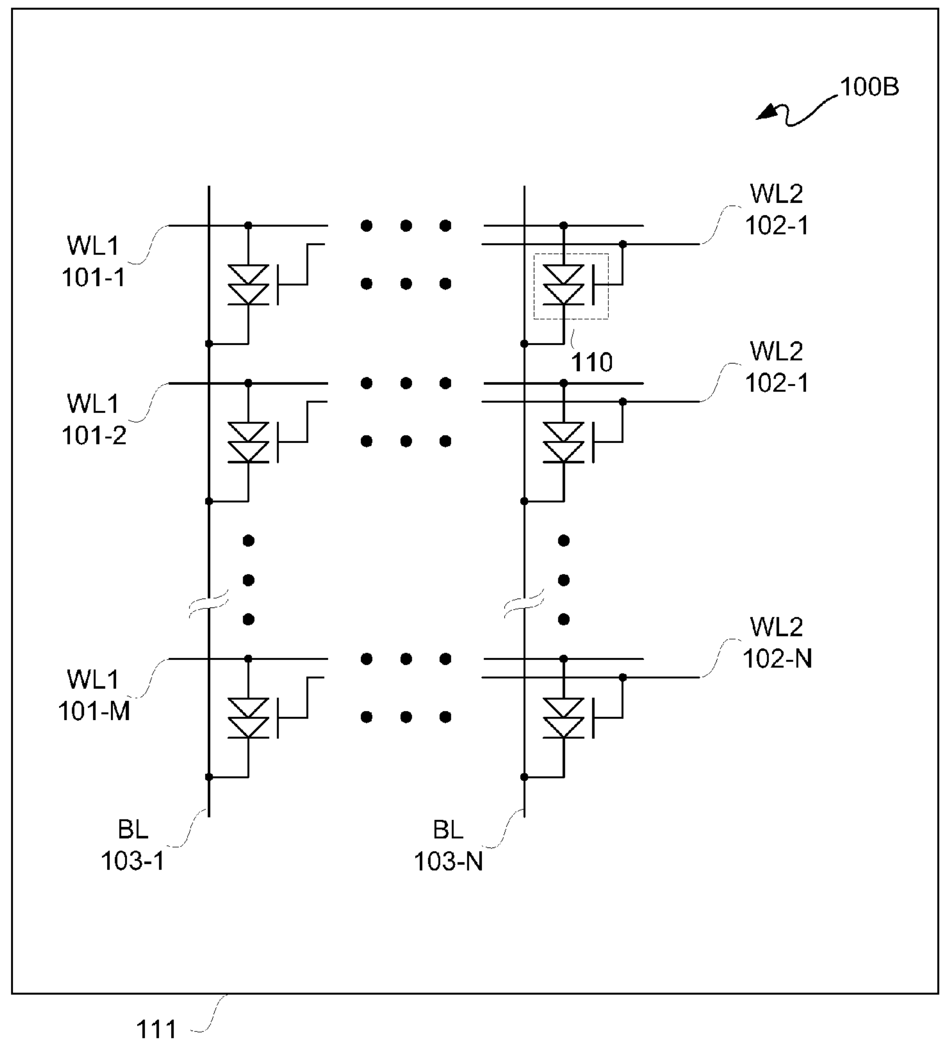

FIG. 1B is a circuit diagram depicting another exemplary embodiment of integrated circuit 111. In this depicted embodiment, integrated circuit 111 includes memory array 100B. Memory array 100B is the same as memory array 100A of FIG. 1A, except that wordlines and bitlines have been swapped and memory cells are n-TCCTs. In other words, first wordlines 101-1 through 101-M are associated with rows of thyristor-based memory cells 110, and bitlines 103-1 through 103-N are associated with columns of thyristor-based memory cells 110. Thus it should be appreciated that first wordlines may be coupled to anodes or cathodes of thyristor-based memory cells, and bitlines may be coupled to anodes or cathodes of thyristor-based memory cells.

Figure 1C:
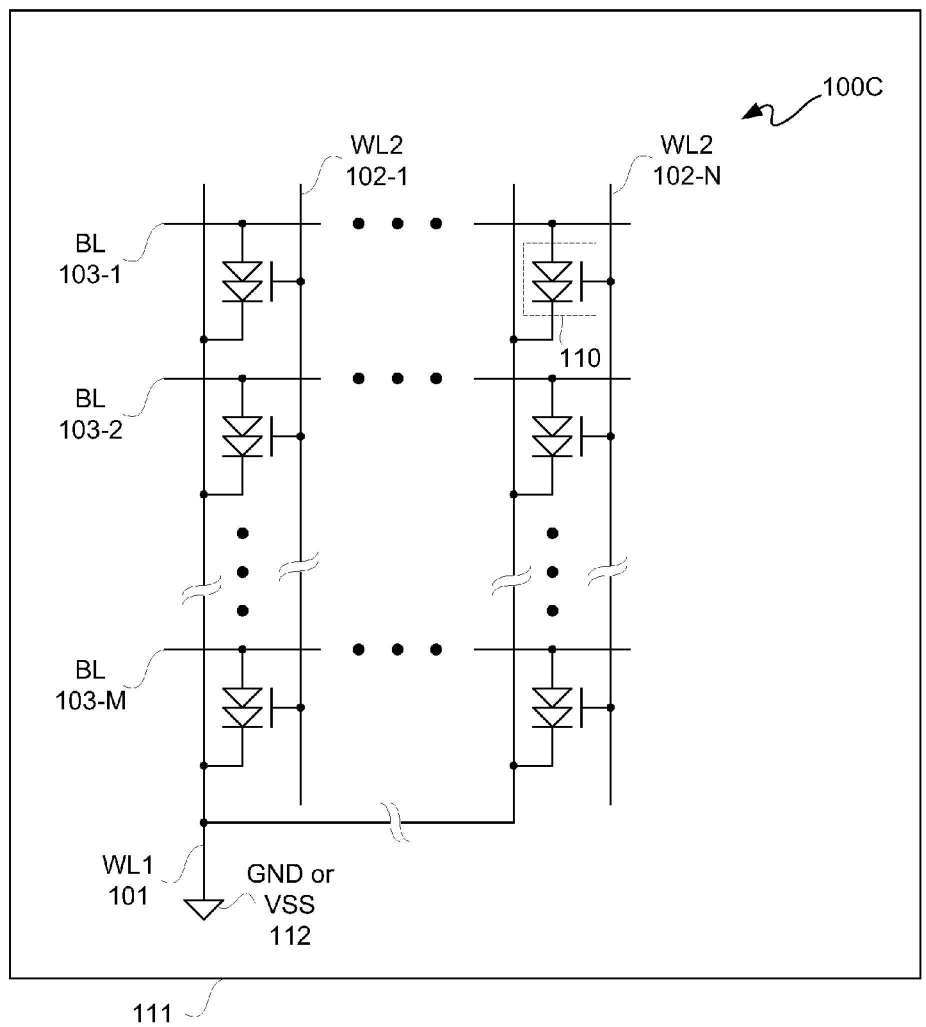

FIG. 1C is a circuit diagram depicting another exemplary embodiment of integrated circuit 111. In the depicted example embodiment, integrated circuit 111 includes memory array 100C. Memory array 100C is the same as memory array 100A of FIG. 1A, except that a single first wordline 101 is illustratively depicted as being coupled to two or more columns of thyristor-based memory cells 110. This configuration is referred to as a "common-plate" WL1 structure or a "common cathode" structure. Such first wordline 101 may be coupled to ground or Vss 112. Thus it should be appreciated that in such an embodiment, voltage on such first wordline 101 may be generally constant at a logic low voltage level, and bitlines 103 and WL2s 102 may be pulsed for operation of array 100C. In the depicted embodiment, all N columns of thyristor-based memory cells 110 are coupled to a same first wordline 101; however, not all N columns need to be connected to the same ground or Vss location. It should be understood that a Vss voltage level may be but is not necessarily a ground voltage level. For example, a VSS voltage level for a WL2 may be less than 0 V.

Figure 1D:
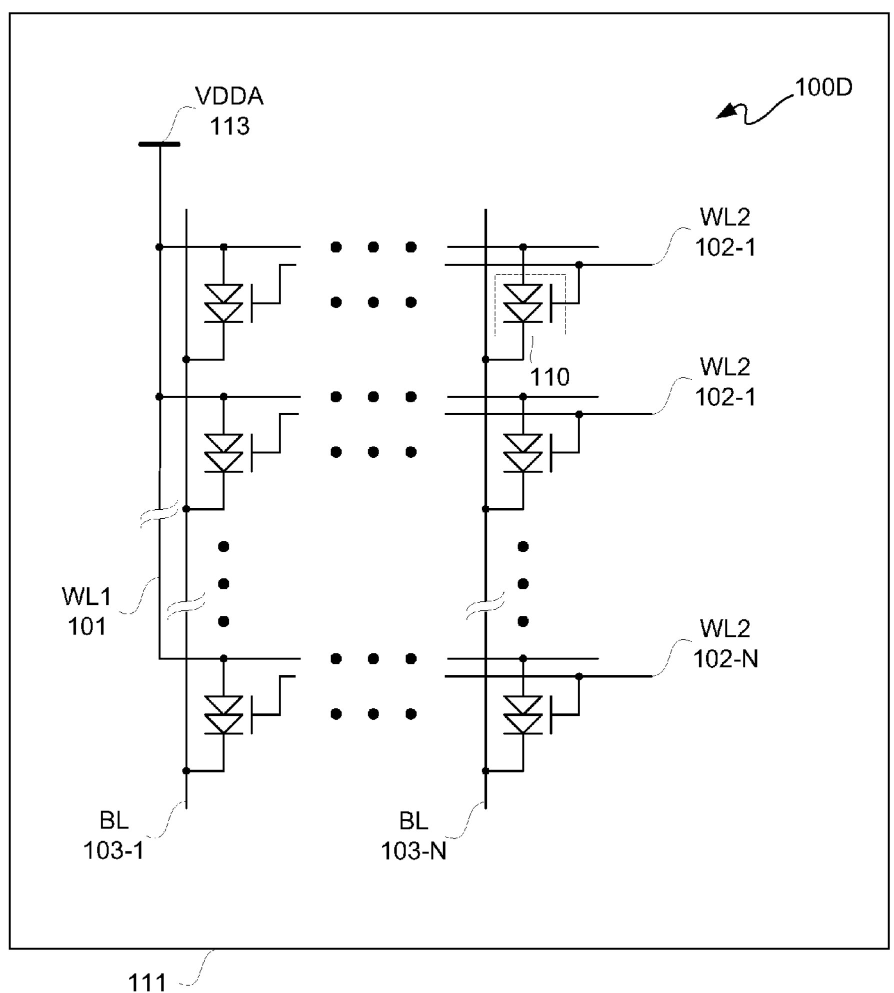

FIG. 1D is a circuit diagram depicting yet another exemplary embodiment of integrated circuit 111. In this depicted embodiment, integrated circuit 111 includes memory array 100D. Memory array 100D is the same as memory array 100B of FIG. 1B, except that two or more first wordlines are coupled together to provide a common or single first wordline 101. In this exemplary embodiment, WL1 101 is coupled to a supply voltage bus, namely VDDA bus 113.

Accordingly, it should be understood that in FIGS. 1C and 1D, respective embodiments of a "common plate" WL1 architecture are described.

Figure 2A:
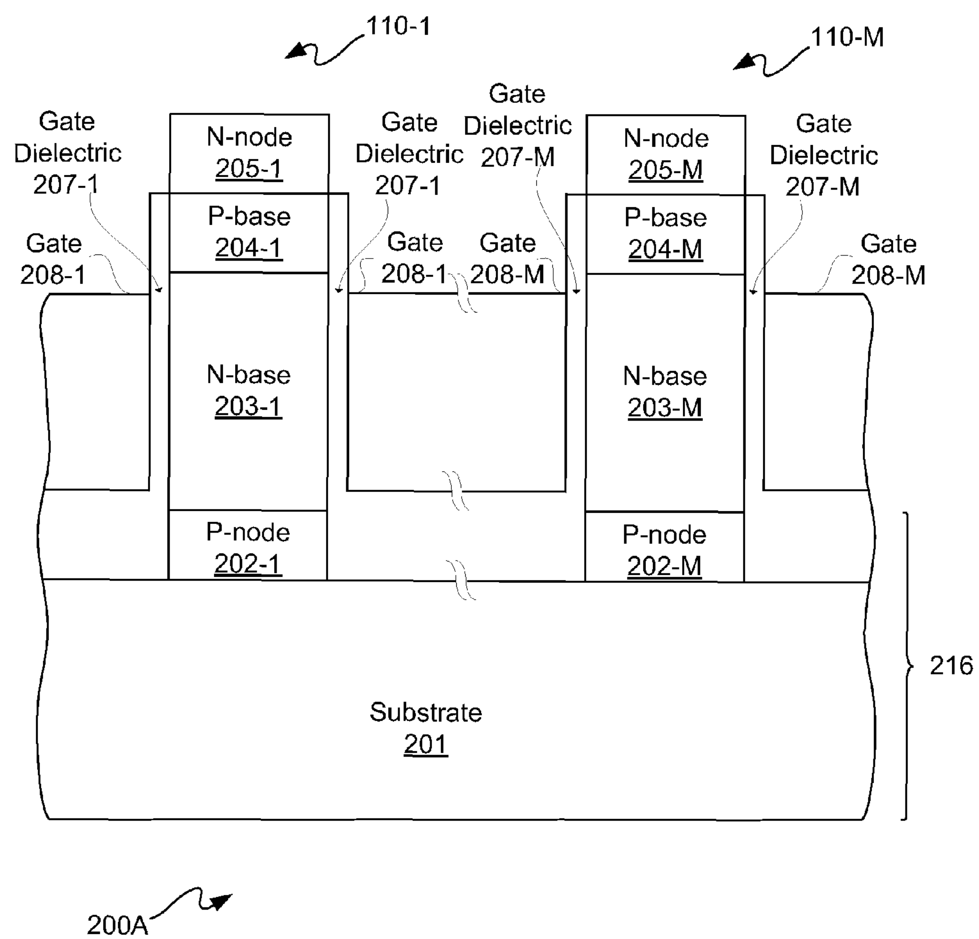
FIGS. 2A and 2B are side-view block diagrams depicting groupings of vertical thyristor-based memory cells of integrated circuits.

FIG. 2A is side-view block diagram depicting a grouping of vertical thyristor-based memory cells 110-1 through 110-M of an integrated circuit 200A. Gates 208-1 through 208-M are connected back-to-back in this cross-section taken along a WL2 102. If such cross-section were taken along a bitline 103, gates 208-1 through 208-M may not appear as being connected as such. Such memory cells 110 may be as described with reference to FIGS. 1A through 1D.

In this exemplary embodiment, vertical thyristor-based memory cells 110-1 through 110-M are depicted as being formed using a bulk semiconductor wafer 216, such as a silicon wafer for example. However, it should be understood that a bulk or semiconductor-on-insulator wafer, including a semiconductor other than silicon, may be used.

Along a top surface of semiconductor substrate 201 may be p-nodes 202-1 through 202-M, which may be a common plate of nodes. Accordingly, it should be understood that p-nodes 202-1 through 202-M may be WL1 101 of FIG. 1C. More particularly, it should be understood that p-nodes 202-1 through 202-M may be emitter nodes of thyristor-based memory cells 110-1 through 110-M, respectively. In this exemplary embodiment, p-nodes 202-1 through 202-M may be doped to be substantially p-type, and more particularly, may be doped to have a $p^+$ doping level.

Formed directly above each p-node may be a respective n-base. More particularly, n-bases 203-1 through 203-M are respectively formed above p-nodes 202-1 through 202-M. Located directly above n-bases may be p-bases. More particularly, p-bases 204-1 through 204-M may be respectively located above n-bases 203-1 through 203-M.

Along sidewalls of the p-n-p stacks of memory cells 110-1 through 110-M may be formed one or more gate dielectric layers, which are indicated as gate dielectrics 207-1 through 207-M so as to be associated with memory cells 110-1 through 110-M. It should be understood that in some embodiments, gate dielectrics 207-1 through 207-M may completely or partially surround p-n-p stacks of memory cells 110-1 through 110-M as well as being along sidewalls thereof.

One or more gate conductive layers may be formed between such p-n-p stacks, which are indicated as gates 208-1 through 208-M so as to be respectively associated with memory cells 110-1 through 110-M. Gates 208-1 through 208-M may be respectively separated from n-bases 203-1 through 203-M by gate dielectrics 207-1 through 207-M. Gates 208-1 through 208-M may be positioned for capacitively coupling to n-bases 203-1 through 203-M, respectively, during an activation operation and/or a precharge operation, as described below in additional detail.

Furthermore, n-nodes may be formed directly above p-bases. More particularly, n-nodes 205-1 through 205-M are respectively formed above p-bases 204-1 through 204-M as other emitter nodes. In this exemplary embodiment, n-nodes 205-1 through 205-M may be doped to be substantially n-type, and more particularly, may be doped to have an $n^+$ doping level.

Accordingly, each memory cell 110-1 through 110-M has a p-n-p-n stack structure. Additional details regarding the formation of vertical thyristor-based memory cells may be found in one or more of the above-referenced U.S. patents.

Figure 2B:
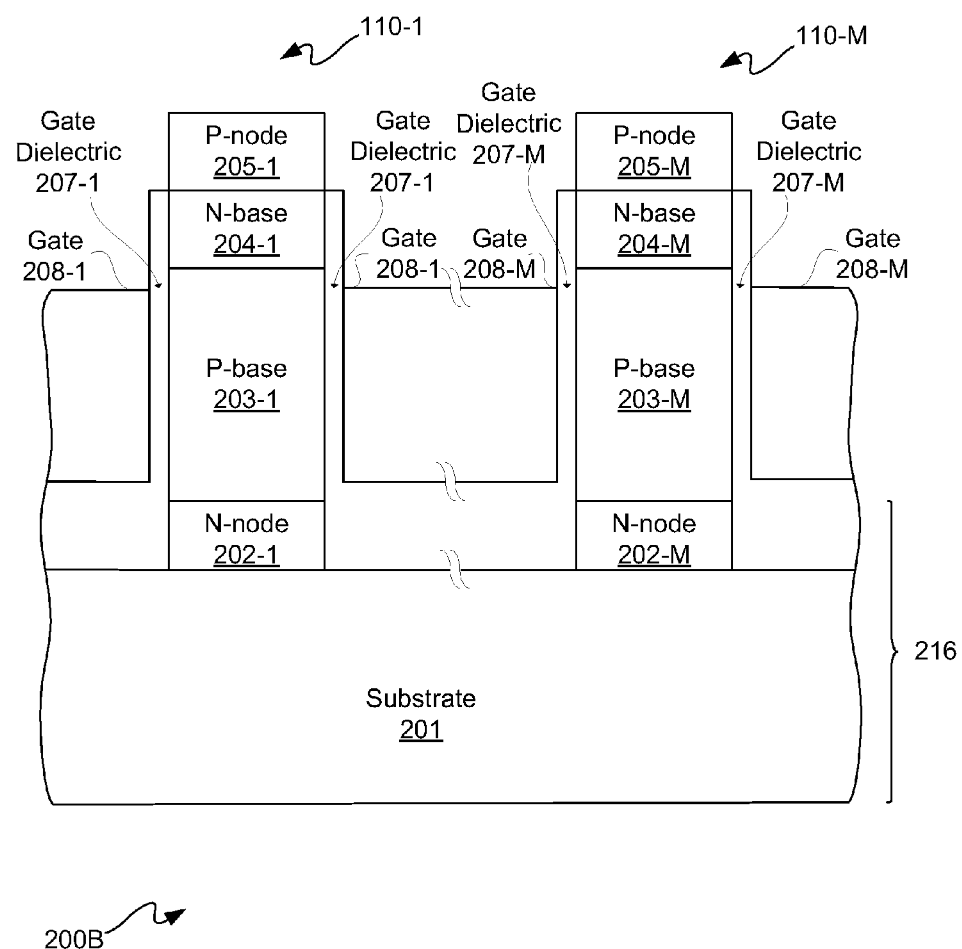

FIG. 2B is a side-view block diagram depicting another exemplary embodiment of vertical thyristor-based memory cells 110-1 through 110-M of an integrated circuit 200B. In this depicted exemplary embodiment, nodes or regions 202-1 through 202-M are n-type, namely n-nodes; bases 203-1 through 203-M are p-type, namely p-bases; bases 204-1 through 204-M are n-type, namely n-bases; and nodes 205-1 through 205-M are p-type, namely p-nodes. In this exemplary embodiment, n-nodes 202-1 through 202-M may be doped to be substantially n-type, and more particularly, may be doped to have an $n^+$ doping level. Furthermore, in this exemplary embodiment, p-nodes 205-1 through 205-M may be doped to be substantially p-type, and more particularly, may be doped to have a $p^+$ doping level. Thus it should be understood that memory cells 110-1 through 110-M of integrated circuit 200B of FIG. 2B have n-p-n-p stack structures.

It should be understood that either sets of nodes 202 or 205 may be coupled to one another to form a "common plate" structure. Accordingly, it should be understood that p-n-p-n or n-p-n-p structures with rows or columns of memory cells having a common plate architecture may be used.

Figure 2C:
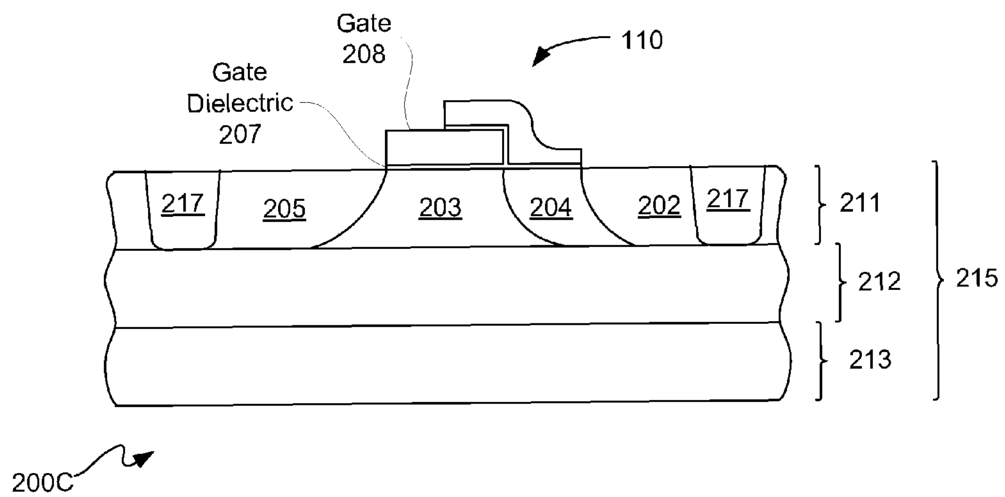
FIGS. 2C and 2D are side-view block diagrams depicting lateral thyristor-based memory cells in semiconductor-on-insulator and bulk integrated circuits, respectively.

FIG. 2C is a side-view block diagram depicting an exemplary embodiment of an integrated circuit 200C having a lateral memory cell 110. In this exemplary embodiment, lateral memory cell 110 is formed on a semiconductor-on-insulator ("SOI") wafer 215 having an active semiconductor substrate layer ("active layer") 211, an insulator layer such as a buried oxide ("BOX") layer 212, and a bottom support substrate layer 213. In active layer 211 are formed a first base 203, a second base 204, and first emitter region 202, and a second emitter region 205. First base 203 may be p-type or n-type as previously described. Second base 204 may be p-type or n-type, as previously described, namely opposite the type of first base 203.

Likewise, first emitter region or node 202 adjacent to second base 204 is of an opposite type of doping than such adjacent base region. Emitter region or node 205 adjacent to first base 203 is likewise of an opposite type doping with respect to such adjacent base region.

A gate dielectric layer providing a gate dielectric 207 may be located directly above a top surface of first base 203, as well as above second base 204. A gate layer providing gate 208 may be located directly above an upper surface of gate dielectric 207. Cells 110 may be separated from one another with isolation regions 217, such as shallow trench isolation ("STI") regions. Some other details regarding formation of lateral thyristor-based memory cells 110 may be found in one or more of the above-referenced U.S. patents.

Figure 2D:
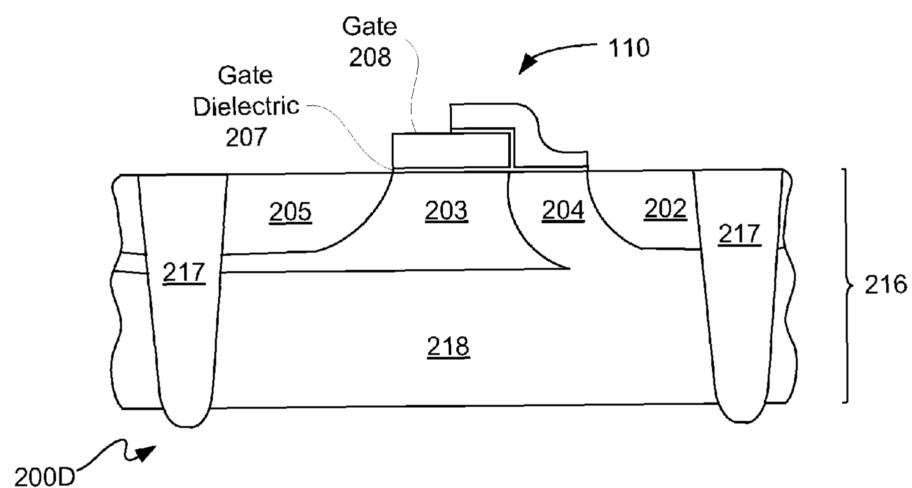

FIG. 2D is a side-view block diagram depicting another exemplary embodiment of a lateral thyristor-based memory cell 110 in an integrated circuit 200D. In this exemplary embodiment, a bulk semiconductor wafer ("substrate") 216 is used for formation of lateral thyristor-based memory cell 110. Isolation regions 217 are formed in substrate 216. Such isolation regions may be STI regions. First base 203 in this exemplary embodiment is formed such that it extends directly above a lightly doped portion 218 of substrate 216, as well as has a portion that extends directly underneath emitter region or node 205. Adjacent to first base 203 may be second base 204, and second base 204 may be contiguous with lightly doped portion 218 and may have a more concentrated doping of a p- or n-type. A portion of second base 204 may extend directly underneath emitter region or node 202. In another embodiment, lightly doped portion 218 may border emitter node 202. Gate dielectric 207 and gate 208 are as previously described with reference to FIG. 2C.

In the following description it shall be apparent that vertical or lateral thyristor-based memory cells 110 may be used, whether such cells are formed using a bulk semiconductor wafer or an SOI wafer. However, for purposes of clarity by way of example and not limitation, it shall be assumed that vertical thyristor-based memory cells are used. Moreover, it shall be assumed that such vertical thyristor-based memory cells are formed using a bulk semiconductor substrate and have a p-base as a first base, namely the base directly located along side a majority of gate 208. Thus it shall be assumed for purposes of clarity and not limitation that an n-p-n-p structure for thyristor-based memory cells 110 is used.

Figure 3:
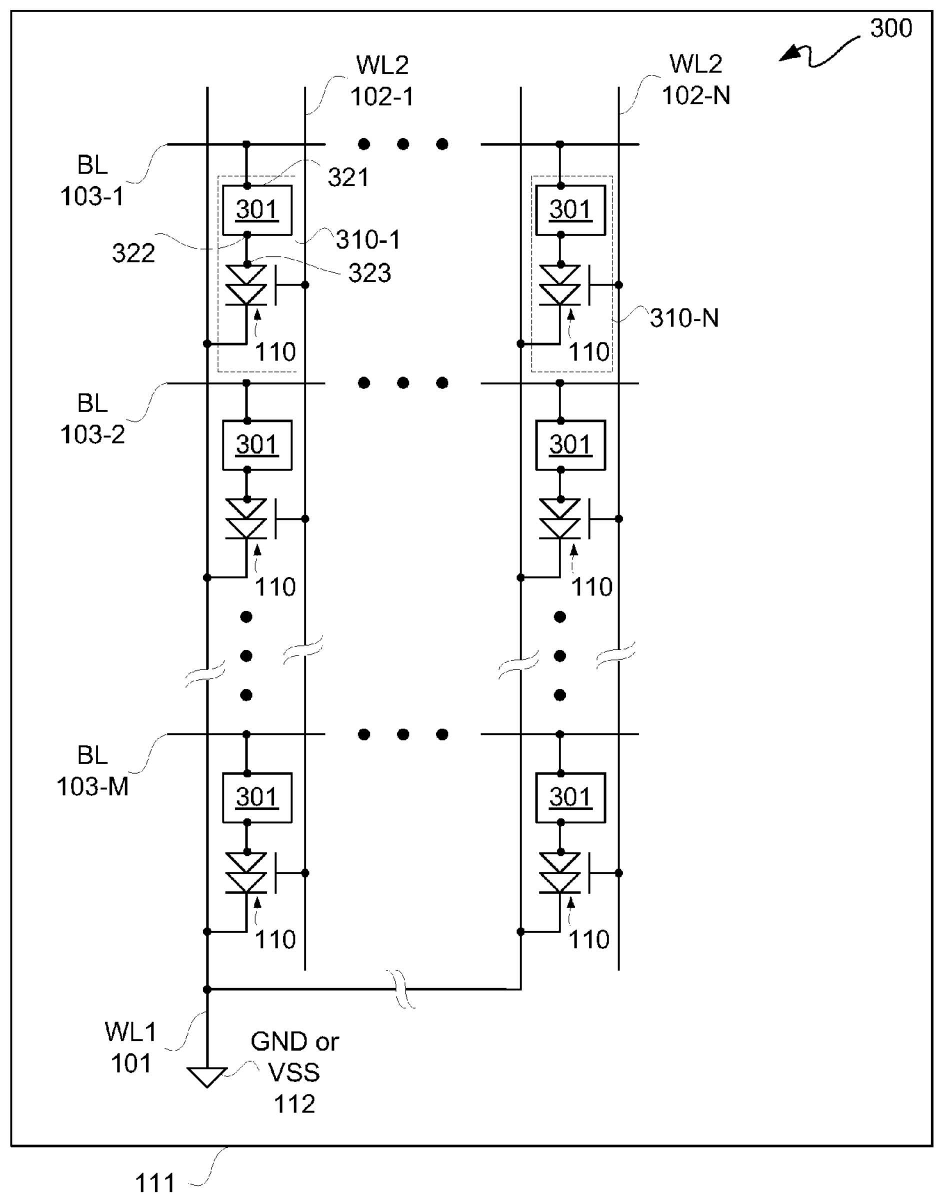
FIG. 3 is a circuit diagram depicting an exemplary embodiment of an integrated circuit having a memory array.

FIG. 3 is a circuit diagram depicting an exemplary embodiment of an integrated circuit 111 having a memory array 300. Memory array 300 has the same components and configuration as memory array 100C of FIG. 1C, except for the addition of phase-change storage elements or cells 301. In memory array 300, each memory cell 310 includes a nonvolatile memory storage element or cell ("memory cell") 301 and a volatile memory storage element or cell ("memory cell") 110. Memory cells 110 are provided as thyristor-based memory dynamic random access memory cells, namely volatile cells, and memory cells 301 are provided as phase-change memory nonvolatile storage cells. Thus, each memory cell 310 includes a pair of memory cells, namely a memory cell 301 and a memory cell 110, of different configurations. Accordingly, memory cells 310 are hybrid memory cells.

A contact or an electrode 321 of each of memory cells 301 is coupled to an associated bitline, such as memory cell 310-1 coupled to bitline 103-1 for example. Another contact 322 of each memory cell 301 is coupled in series with an anode region or anode emitter region 323 of an associated memory cell 110. Accordingly, each hybrid memory cell 310 is formed of a pair of storage elements, namely a memory cell 301 and a memory 110, coupled in series. A cathode region or cathode emitter region of memory cell 110 is coupled to WL1 101, which is coupled to a logic low level, such as Vss or ground 112.

Memory array 300 has a common plate architecture. It should be understood that by pulsing a WL2 102, a conductive path may be formed through memory cells 110 coupled to such WL2 102, where anode emitter region 323, and thus electrode 322, is electrically coupled to ground 112 via WL1 101.

It should be appreciated that by having a thyristor-based storage element, such memory cell 110, it may be used as an access or selector device for a phase-change storage element, such as memory cell 301. This facilitates use of a common plate architecture, as WL2s 102 allow memory cells 310 to be accessed without having to have independent columns or rows of WL1s, such as described with references to FIGS. 1A and 1B.

It should further be understood that if independent WL1s were implemented, then current drive through those WL1s would have to be significantly limited in comparison to the common plate architecture of memory array 300. Furthermore, it should be understood that a conductive path formed through memory cells 110 is generated by capacitive coupling, namely from a gate to a base region, or base regions, of a thyristor-based storage element. In other words, because of capacitive coupling from gate to base, generally all current flowing through memory cell 310 flows from a bitline 103 to ground 112, namely without "dumping current" onto a WL2. This is to be contrasted with a BJT as an access device, as a BJT "dumps current" onto a gate line significantly limiting array size.

Figure 4:
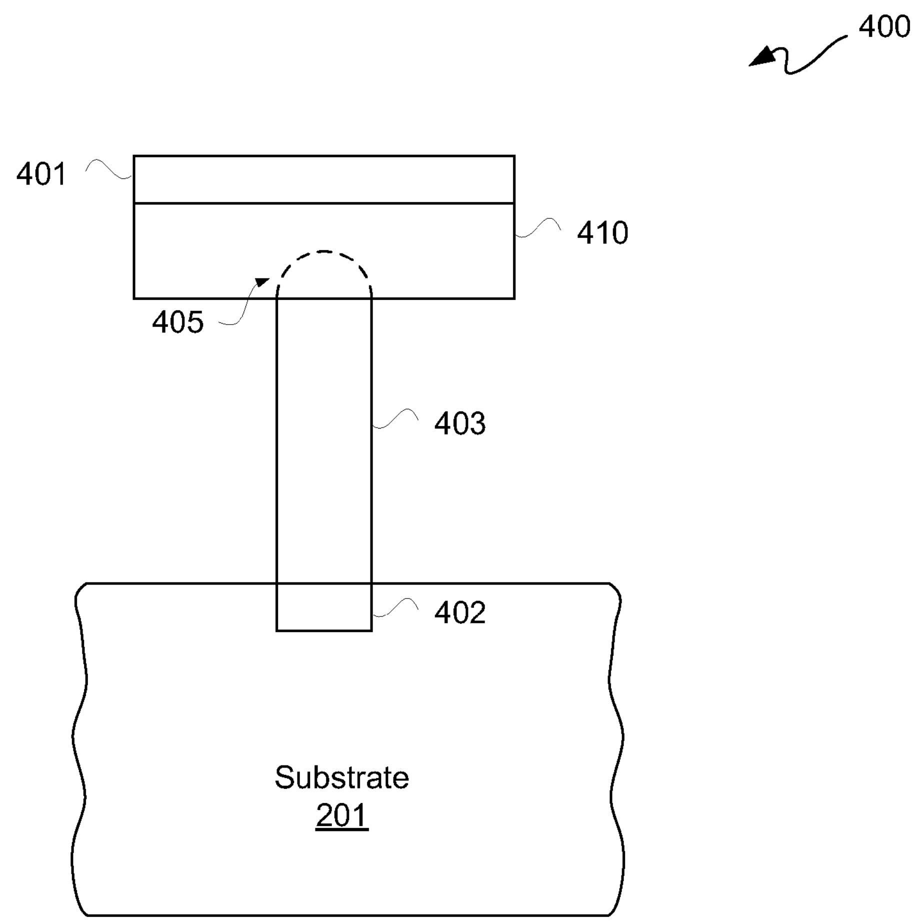
FIG. 4 is a cross-sectional side view depicting an exemplary embodiment of a phase-change storage element.

FIG. 4 is a cross-sectional side view depicting an exemplary embodiment of a phase-change storage element 400. Phase-change storage element 400 includes top electrode 401, phase-change material 410, resistive element 403, and bottom electrode 402. A portion 405 of resistive element 403 may extend into phase-change material 410. Furthermore, bottom electrode 402 may be formed in a metal layer or a semiconductor substrate 201, which in this exemplary embodiment is a bulk semiconductor substrate. However, it should be appreciated that a SOI substrate or wafer may be used.

In this exemplary embodiment, phase-change material 410 is a chalcogenide. However, it should be understood that phase-change storage element 400 may be any phase-change storage element or any other type of resistive-RAM (RRAM) memory element having top and bottom electrodes, or more generally having two electrodes for coupling to a bitline at one end and a node of an access device at another end. For purposes of clarity by way of example and not limitation, phase-change memory ("PCM") is described herein as it will be apparent from such description that any other type of RRAM may be used. Accordingly, phase-change storage element 400 is further described with simultaneous reference to FIGS. 3 and 4.

Bottom electrode 402 may be contact 322 of FIG. 3 for coupling to ground 112 by pulsing a WL2 of an associated memory cell 110. Top electrode 401 may be contact 321 of FIG. 3 for being coupled to a bitline 103.

It should be understood that phase-change material 410 has two states, namely a low resistance state and high resistance state. Generally, in the low resistance state, phase-change material 410 is of a polycrystalline lattice structure, and generally in the high resistance state, phase-change material 410 is of an amorphous crystalline structure.

Memory cell 110 acts as a selector or access device for memory cell 301, which may be phase-change storage element 400, as memory cell 301 may be selectively coupled to ground 112 via an associated memory cell 110. Furthermore, it should be appreciated that this coupling to ground is assisted by capacitive coupling from a gate to a base of memory cell 110. It should be understood that the conductive path through induced in memory cell 110 by capacitive coupling, as opposed to direct coupling, does not "dump" current onto a WL2.

It should further be understood that current that flows from a bitline through a memory cell 310, namely through a phase-change storage element from a top electrode 401 to a bottom electrode 402 and then through a thyristor-based storage element to a common ground, may be substantial. In short, memory cell 310 is capable of tolerating a substantial amount of drive current. Again, such drive current does not get dumped onto WL2s, and so memory array 300 is capable of having longer WL2s. Furthermore, because more drive current may be tolerated, larger programming currents may be tolerated.

While in one embodiment, TCCT element 110 in memory cell 310 may be purely used as an access or select device for the PCM memory element 301 to provide the benefit of high current drive without excessive WL current, optionally memory cell 310 may be operated to provide a "hybrid" volatile/non-volatile memory cell for additional benefits.

Figure 5:
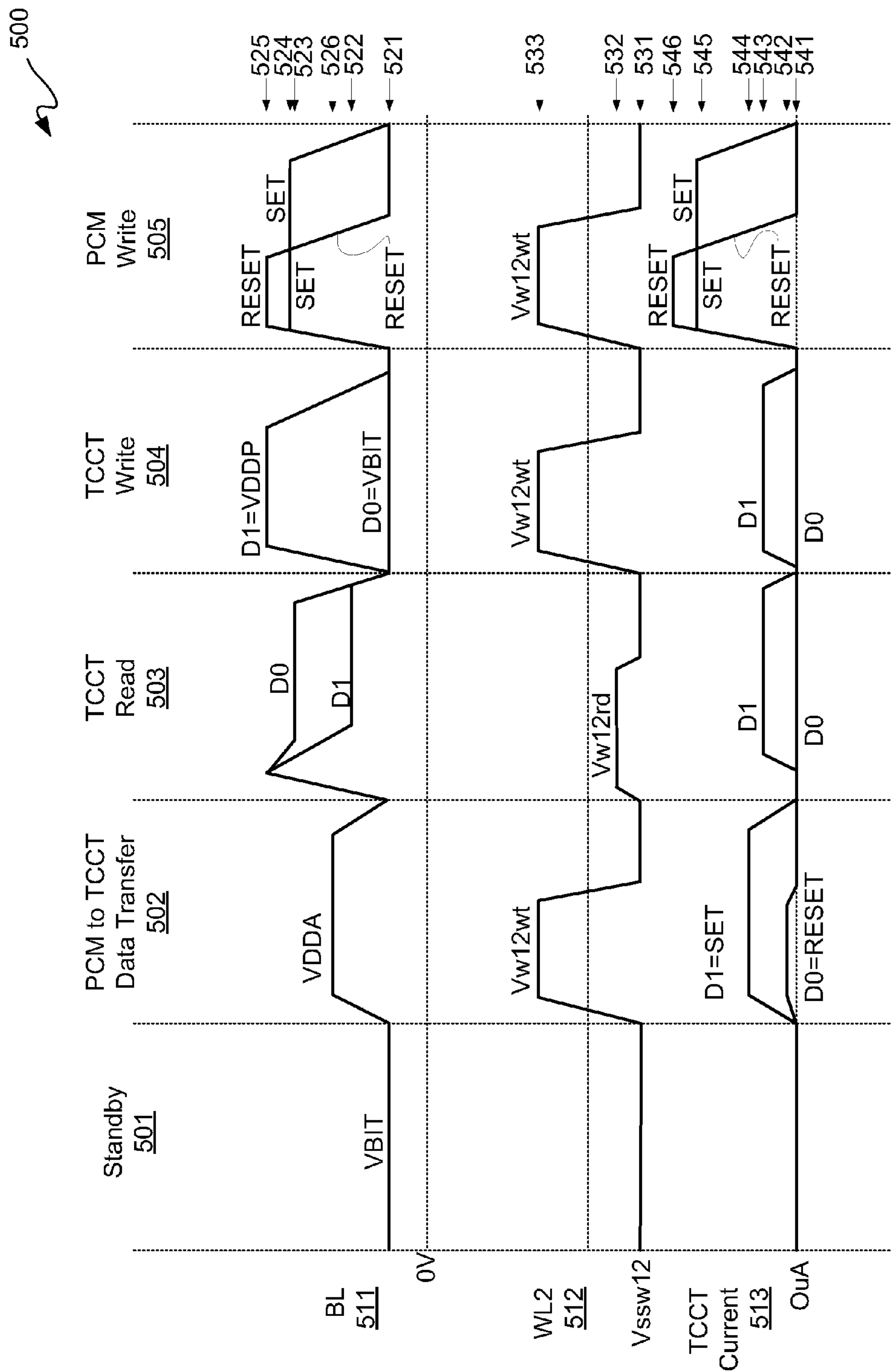
FIG. 5 is a signal diagram depicting an exemplary embodiment of operations for the memory array of FIG. 3.

FIG. 5 is a signal diagram depicting an exemplary embodiment of "hybrid" operations 500 for memory array 300 of FIG. 3. Operations 500 include five states, namely a standby state 501, a phase-change memory ("PCM") to TCCT data transfer state 502, a TCCT read state 503, a TCCT write state 504, and a PCM write state 505. Operations 500 are further described with simultaneous reference to FIGS. 3, 4, and 5.

In a volatile mode of operation, TCCT memory cells store data, while PCM memory cells may be operated above a threshold voltage or may be programmed to set state at the beginning of a write cycle or on an initial access only. In a non-volatile mode, PCM memory cells store data while TCCT memory cells may be operated as access devices.

Bitline voltage signal 511 may be voltage on a bitline 103. WL2 voltage signal 512 may be voltage on a WL2 102. TCCT current 513 indicates the amount of current flowing through a memory cell 110.

Even though approximate ranges are provided for purposes of clarity by way of example and not limitation in describing the embodiment of FIG. 5, it should be understood that other ranges may be used without departing from the scope hereof. It should be understood that operations 500 are for a common plate architecture memory array 300 employing a p-base as a first or main base. However, it should be understood that a common plate architecture using an n-TCCT cells instead of p-TCCT cells may be used.

During standby state 501, bitline voltage signal 511 is at a bit voltage level ("VBIT") 521, which in this exemplary embodiment is in a range of approximately 0 to 0.5 volts. In standby state 501, WL2 voltage signal 512 is at a logic low WL2 voltage level ("Vsswl2") 531, which in this exemplary embodiment is in a range of approximately −2 to −0.5 volts. During standby state 501, current flow through a p-TCCT cell, namely TCCT current signal 513 is at approximately 0 microamps.

It should be understood that generally during operation assuming a phase-change storage element has been programmed either to a high resistance state or a low resistance state, when a read pulse is applied to a WL2 of an associated thyristor-based storage element for electrically coupling a top electrode 322 to ground 112, voltage drop on an associated bitline 103 will be affected by which state, namely high or low resistance state, such phase-change storage element is in. If memory cell 301 is in a high resistance state, then there will be less voltage drop or current to ground loss on a bitline 103 than if memory cell 301 is in a low resistance state. Furthermore, memory cell 301 state may be used to program state of an associated memory cell 110 when a write pulse is applied to an associated WL2 102 of such memory cell 110. Accordingly, operations 500 describe data transfer from a memory cell 301 to a memory cell 110 of a hybrid memory cell 310 with reference to PCM to TCCT data transfer state 502. Even though the description is for a single memory cell, it should be understood that a grouping of memory cells, such as a column or a row for example, may be used for transferring data to and from memory cells 301 and 110 of hybrid memory cells 310.

Generally at the beginning of PCM to TCCT data transfer state 502, bitline voltage signal 511 is at bit voltage level 521 and WL2 voltage signal 512 is at a logic low WL2 voltage level 531. From such voltage levels, bitline voltage signal 511 is transitioned to a VDDA voltage level 526 and pulsed at such level up until approximately the end of state 502, when bitline voltage signal 511 may be transitioned back down to bit voltage level 521. WL2 voltage signal 512 is pulsed to a write WL2 voltage level ("Vwl2wt") 533 during state 502, and may be transitioned down to a logic low WL2 voltage level 531 prior to transitioning bitline voltage signal 511 to bit voltage level 521 within state 502. In this exemplary embodiment, VDDA 526 may be in a range of approximately 1.2 to 1.5 volts, and WL2 write voltage level 533 may be in a range of approximately 1 to 1.5 volts.

It should be understood with respect to PCM, the term "set" means that phase-change memory is in a low resistance state, or more particularly, phase-change material 410 is in a substantially conductive state, such as a polycrystalline state for example. The term "reset" is used to refer to placing a PCM in a high resistance state, or more particularly, phase-change material 410 is in a substantially nonconductive state, such as an amorphous crystalline state for example.

Responsive to voltage signals 511 and 512, current through p-TCCT memory cell 110 transitions, and the amount of transition depends on whether memory cell 301 is in a set state or a reset state. Generally, a set state, which again is a low resistance state, refers to a data 1 ("D1") state, and a reset state, again which is a high resistance state, refers to a data 0 ("D0") state. If memory cell 301 is in a set state, then a D1 is effectively transferred to an associated memory cell 110 during state 502 with TCCT current 513 generally rising from approximately 0 microamps level 541 to a D1 or set current level 544, which in this exemplary embodiment is in a range of approximately 5 to 100 microamps. If, however, memory cell 301 is in a reset state, then a D0 is effectively transferred to an associated memory cell 110 during state 502 with TCCT current signal 513 transitions from approximately 0 microamp level 541 to a D0 or reset current level 542, which in this exemplary embodiment is in a range of approximately 0 to 1 microamps.

It should be understood that the term "transfer" as used herein does not necessarily mean taking from one place and putting in another place. For example, a memory cell 301 may retain its data state after effectively transferring such data state to an associated memory cell 110 in a hybrid memory cell 310. Furthermore, a memory cell 110 may retain its data state after effectively transferring such data state to an associated memory cell 301 in a hybrid memory cell 310. However, memory cell 110, unlike memory cell 301, loses its data state when power is not present or switched off. Furthermore, as described below in additional detail, memory cells 301 may all be placed in a set state for operation in a volatile mode.

For a reset or D0 transfer, a current pulse on TCCT current signal 513 transitions back down to approximately a 0 microamp level 541 generally with the transitioning of a pulse on WL2 voltage signal 512 back down to a logic low WL2 level 531. For a set or D1 state, a current pulse on TCCT current signal 513 transitions back to approximately a 0 microamp level 541 generally with transitioning of a pulse on bitline voltage signal 511 back down to bit voltage level 521. Accordingly, it should be understood that by raising bitline voltage and WL2 voltage to write levels, data, whether a D1 or a D0, may be transferred from a PCM to an associated TCCT cell during state 502.

At this point, it should be understood that memory array 300 is a hybrid array, or more particularly, memory cells 310 are hybrid cells, namely cells with both nonvolatile and volatile storage cells. Furthermore, it should be understood that thyristor-based storage elements or memory cells 110 are affectively DRAM cells. As DRAM cells, the level of endurance of such cells is significantly higher than that of phase-change storage elements or memory cells 301. This facilitates a dual mode of operation.

Generally it should be understood that nonvolatile data may be stored in memory cells 301 and then such nonvolatile data may be transferred to volatile memory cells 110. Operations of an application may be based on use of data stored in volatile memory cells 110 so as not to diminish the endurance of nonvolatile memory cells 301. By endurance, it should be understood that after a number of reads and writes (generally writes are the limiter), a memory cell may fail or breakdown. PCM memory cells 301 do not have sufficient endurance to be operated as DRAM, unlike thyristor-based memory cells 110.

Thus in a dual mode of operation, there is a volatile mode and a nonvolatile mode. In the volatile mode, both PCM memory cells 301 and TCCT memory cells 110 may store data; however, to save useful life of PCM memory cells 301, TCCT memory cells 110 are at least used significantly more, if not exclusively, for reads and writes of data during operation. Thus, after transfer of data from PCM memory cells 301 to associated TCCT memory cells 110, PCM memory cells 301 may all be placed in their conductive state. In a nonvolatile mode, PCM cells 301 stored data, while TCCT cells 110 are operated as access devices.

Returning to state 502, it should be understood that VDDA voltage level 526 is below a lower threshold voltage level of PCM cells 301. Thus, bitline voltage applied during state 502 does not program PCM memory cells 301; however, such VDDA voltage level 526 provided via a bitline 103 as indicated by bitline voltage signal 511 is sufficient to program associated TCCT memory cells 110, namely to a D1 state when an associated PCM cell 301 is in a set or a low resistance state. In short, the D1 is effectively transferred from bitline 103 via a PCM memory cell 301 at a D1 state into an associated TCCT memory cell 110, where such transfer into such TCCT memory cell 110 is further effectuated by a write level voltage applied to an associated WL2 102.

Thus, for going from a nonvolatile mode to a volatile mode, bitlines are operate below a PCM threshold voltage and TCCT WL2s are "kick" pulsed to a write to TCCT voltage level.

TCCT read state 503, bitline voltage signal 511 may be transitioned from bit voltage level 521 to a VDDP voltage level 525 before transitioning down to either a D0 voltage level 523 or a D1 voltage level 522. By a VDDP voltage level, it is generally meant a supply voltage level for p-TCCT memory cells 110 that is above a threshold PCM voltage, which in this exemplary embodiment is in a range of approximately 2 to 3 volts. It should be appreciated that only one of these two voltage levels, either a D0 or a D1 voltage level, is present at a time on signals 511 and 513; however, both are shown together for purposes of clarity to contrast these two states. Generally at the end of state 503, bitline signal 511 may be transitioned back down to bit voltage level 521. In this exemplary embodiment, D1 voltage level 522 is in a range of approximately 0.5 to 1 volts, and D0 voltage level 523 is in a range of approximately 1.5 to 3 volts.

For TCCT read state 503, a read pulse, namely a WL2 read voltage level ("Vwl2rd") 523 pulse, is applied on WL2 voltage signal 512 generally at the beginning of state 503, and may be transitioned back down to a logic low WL2 voltage level 531 later in such state. For this exemplary embodiment, WL2 read voltage level is in a range of approximately 0.5 to 1 volts above Vsswl2. For memory cell 301 in a set or D1 state, TCCT current signal 513 may be at a D1 read current level 543, which in this exemplary embodiment is in a range of approximately 5 to 100 microamps. For memory cell 301 in a D0 or reset state, TCCT current signal 513 may be at approximately a 0 microamp level 541. A D1 current pulse for TCCT current signal 513 in state 503 generally lags front end transitioning of voltage signals 511 and 512, but generally at the end of state 503, such D1 pulse may transition back down to approximately a 0 microamp level 541 with the back end transitioning of bitline voltage signal 511.

For a write of a D1 during TCCT write state 504, bitline voltage signal 511 may be transitioned from bit voltage level 521 to VDDP along with the transitioning of an associated WL2 write pulse. Such WL2 write pulse may be transitioned back down, as previously described with reference to state 502, and thereafter such bitline voltage pulse may be transitioned back down to bit voltage level 521. For a write of a D0 during TCCT write state 504, generally at the beginning of such state, WL2 voltage signal 512 is transitioned from a WL2 logic low voltage level 531 to a WL2 write voltage level 533 as previously described, and bitline voltage signal 511 is maintained at bit voltage level 521 throughout TCCT write state 504. Later in TCCT write state 504, such WL2 write pulse is transitioned back down to a logic low WL2 voltage level 531 as previously described.

For TCCT write state 504, a current pulse for a D1 level transitions to write current level 543 in TCCT write state 504. Furthermore, such current pulse for the D1 level transitions back down to current level 541 before the end of TCCT write state 504. For TCCT write state 504, a D0 is at current level 541 throughout the state.

For PCM write state 505, bitline voltage signal 511 is transitioned from bit voltage level 521 to reset voltage level 525 for providing a reset pulse for resetting to a high resistance state, namely a D0 state, and then such bitline voltage signal 511 is generally transitioned back down to bit voltage level 525 generally in a middle section of PCM write state 505. For writing a D1 during PCM write state 505, bitline voltage signal 511 is transitioned from bit voltage level 521 to either a set voltage level 524 or a reset voltage level 525 for providing a set or a reset pulse, respectively, for setting to a low or a high resistance state, respectively. Set voltage level 524 of a set pulse used to write a D1 is maintained longer, approximately twice as long in this exemplary embodiment, as a reset voltage level 525 of a reset pulse used to write a D0. Generally at the end of PCM write state 505, bitline voltage signal 511 may be transitioned from set voltage level 524 to bit voltage level 521. Generally at about the middle of PCM write state 505, bitline voltage signal 511 may be transitioned from reset voltage level 525 to bit voltage level 521. During PCM write state 505, a pulse on WL2 voltage signal 512 is used, and such pulse is the same as previously described for TCCT write state 504, and such description is not repeated for purposes of clarity.

For writing a D1 during PCM write state 505, TCCT current signal 513 is transitioned from current level 541 to either a set current level 545 or a reset current level 546 for providing a set or a reset pulse, respectively, for setting to a low or high resistance state, respectively. Set current level 545 of a set pulse used to write a D1 is maintained longer, approximately twice as long in this exemplary embodiment, as a reset current level 546 of a reset pulse used to write a D0. Generally at the end of PCM write state 505, TCCT current signal 513 may be transitioned from set current level 545 to current level 541. Generally at about the middle of PCM write state 505, TCCT current signal 513 may be transitioned from reset current level 546 to current level 541.

For TCCT to PCM data transfer, a sequence of TCCT read 502 followed by PCM write 505 may be performed. Thus, in going from a volatile mode to a nonvolatile mode, TCCT memory cells are read including having bitline voltage exceed a PCM memory cell voltage threshold level, and then data states read from such TCCT memory cells may be written back to their corresponding PCM memory cells, using such TCCT memory cells as respective access devices to their corresponding PCM memory cells. Read data out of TCCT may be held in a sense amplifier or read data buffer at the conclusion of TCCT read 502 and then be written back into PCM element of the same memory cell during PCM write 505.

Accordingly, it should be understood that a nonvolatile to volatile cell data transfer and a volatile to nonvolatile cell data transfer within a hybrid memory cell 310 may be used. Furthermore, it should be understood that data may be transferred from a nonvolatile cell, such as a phase-change memory cell 301, to a volatile cell, such as thyristor-based memory cell 110, of a hybrid memory cell 310, during initial power-up or operation, and thus subsequent DRAM operation may just use volatile memory cells, namely memory cells 110, until or during a power-down cycle. For powering down or putting into a standby state, data in volatile cells, namely thyristor-based storage elements 110, may be transferred back to their associated nonvolatile cells, namely associated memory cells 301. After such transfer of data to nonvolatile cells, memory array 300 may be power down or put in standby state 501 to save power.

In the example embodiment, voltage VDDP is brought above a PCM threshold voltage, namely set voltage 524, for some operations; however, a volatile DRAM mode may be used without exceeding such threshold voltage. Optionally, data may be transferred from phase-change memory cells 301 to their thyristor-based storage counterpart memory cells 110 during a power up or initial cycle of operation, followed by placing all such phase-change storage cells 301 in their low resistance state. By placing for example all phase-change storage elements 301 of array 300 in their low resistance state, thyristor-based storage elements 110 may be operated with lower voltages so as to save power and enhance endurance. At a conclusion or prior to a standby state of operations, data in thyristor-based memory cells 110 may be transferred to their counterpart phase-change memory cells 301.

It should be understood that PCM endurance limitations as a DRAM replacement are overcome by having hybrid cells 310. Furthermore, the ability to maintain data in PCM with power-down facilitates a zero standby/leakage power for DRAM. Additionally, it should be understood that hybrid memory cells 310 have PCM non-volatility with DRAM performance as implemented via thyristor-based memory cells. It should further be understood that TCCT cells, as access devices, to PCM cells provide much higher cell current density than a MOSFET. Furthermore, TCCT cells as access devices have select capability in contrast to a diode access device. Additionally, as previously described, TCCT cells as access devices to PCM cells have no WL2 selected current dumped as compared with a BJT or diode access device. Because of the ability to capacitively couple and thus not dump current onto WL2s, effectively cell size is reduced by avoiding wordline current buildup limitations.

Figure 6:
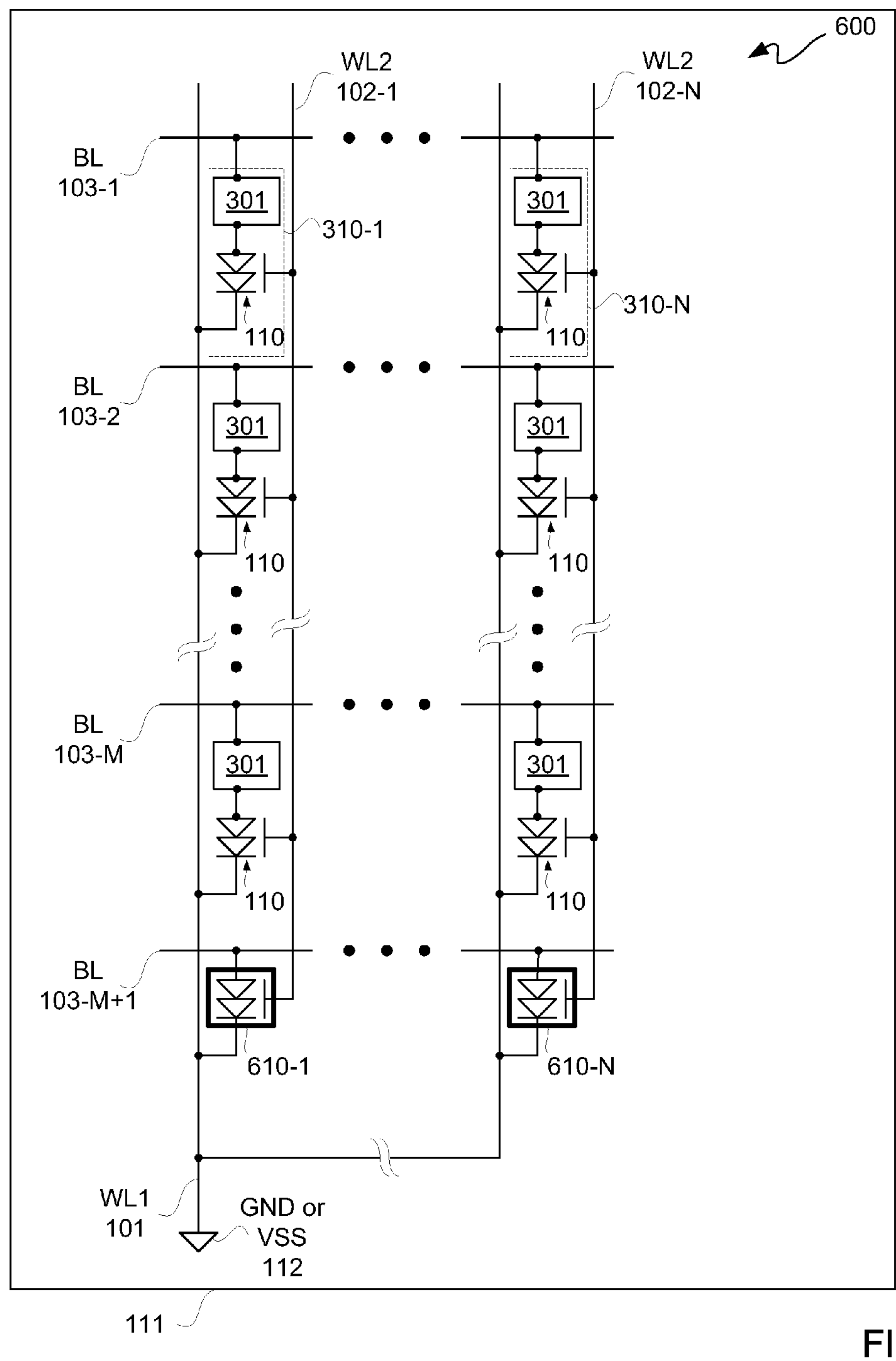
FIG. 6 is a circuit diagram depicting an exemplary embodiment of another memory array.

FIG. 6 is a circuit diagram depicting an exemplary embodiment of a memory array 600. Memory array 600 is the same as memory array 300 of FIG. 3, but with the addition of additional storage elements 610-1 through 610-N. Each WL2 102-1 through 102-N has an additional memory cell, namely respectively storage elements 610-1 through 610-N coupled to an additional bitline 103-M+1. Though storage elements 610-1 through 610-N are illustratively depicted as thyristor-based storage element, other types of storage elements may be used. For example, storage elements 610-1 through 610-N may optionally be thyristor and PCM hybrid memory elements similar to memory cells 310, or may be PCM or other type of RRAM cells.

Storage elements 610-1 through 610-10 for each WL2 may be used to store indicator bits to indicate whether data on an associated WL2 102 has been transferred from nonvolatile cell to a volatile cell for such wordline, and whether data has been transferred from a volatile cell to a nonvolatile cell for such wordline, namely within hybrid memory cells 310 of such wordline. In other words, indicator bits may be used to indicate where valid data is located as between memory cells 110 and 301. Rather than adding additional cells to each wordline, banks of cells may be used for storing status of nonvolatile to volatile and volatile to nonvolatile data transfer for hybrid memory cells 310 of wordlines 102.

Accordingly, it should be appreciated that the nonvolatility of PCM memory with the high speed and endurance of thyristor-based memory cells is provided within a single array. Such array may have uses in mobile devices, where for example prior to losing battery power, data may be transferred to nonvolatile memory from volatile memory. Furthermore, hybrid memory cell array 300 may be used in hot-swappable systems, where states of system memory stored in thyristor-based storage elements 110 are written to corresponding phase-change storage elements 301 prior to removing a disk drive or other component, and upon installing such disk drive or other component system memory may be reloaded with the prior configuration by transferring data from phase-change storage elements 301 to their corresponding thyristor-based storage elements 110.

Figure 7:
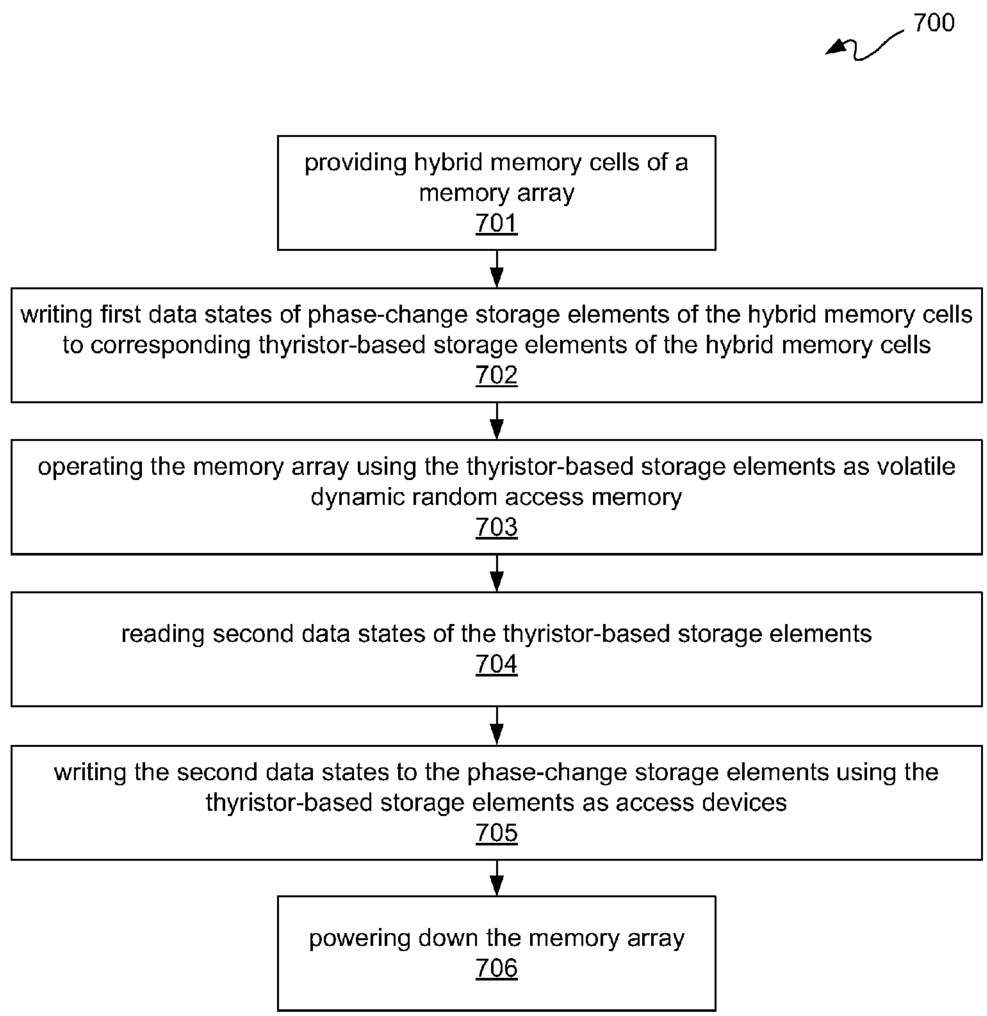
FIG. 7 is a flow diagram depicting operations for operating the memory array of FIG. 3 or 6.

FIG. 7 is a flow diagram depicting operations 700 for operating a memory array. Operations 700 are further described with simultaneous reference to FIGS. 3 through 7.

At 701, a memory array 300 or 600 having hybrid memory cells 310 is provided. Hybrid memory cells 310 as previously described each have a memory cell 301 and a memory cell 110.

At 702, memory array 300 or 600 may be put in a volatile dynamic random access memory mode of operation. For such mode, first data states of memory cells 301 of hybrid memory cells 310 are written to corresponding memory cells 110 of hybrid memory cells 310. Memory array 300 or 600 may then be operated using memory cells 110 as volatile dynamic random access memory. Memory array 300 or 600 may be operated above a threshold voltage of memory cells 301 at 703. Optionally at 703, memory cells 301 may all be written to their low resistance state followed by operating below such threshold voltage. Furthermore, to maintain data states in memory cells 110 over a period of time of operation, memory cells 110 may be periodically refreshed by a refresh operation.

Using operations at 704 and 705, memory array 300 or 600 may be put in a nonvolatile memory mode of operation. For such mode, second data states of memory cells 110 may be read at 704. It should be understood that as memory array 300 or 600 is used, first data states may or may not change to provide second data states.

At 705, the second data states are written to memory cells 301 using corresponding memory cells 110 as respective access devices.

At 706, memory array 300 or 600 may be powered down. Such powering down may cause the second data states in memory cells 110 to be effectively erased. However, the second data states are preserved in memory cells 301.

While the foregoing describes exemplary embodiment(s) in accordance with one or more aspects of the invention, other and further embodiment(s) in accordance with the one or more aspects of the invention may be devised without departing from the scope thereof, which is determined by the claim (s) that follow and equivalents thereof. Claim(s) listing steps do not imply any order of the steps. Trademarks are the property of their respective owners.

What is claimed is:

1. An integrated circuit, comprising:
an array of memory cells;
each of the memory cells including a resistance-change storage element and a thyristor-based storage element coupled in series;
wherein in first mode of operation, the thyristor-based storage elements are used as dynamic random access memory; and
wherein in a second mode of operation, the thyristor-based storage element is an access device for the resistance-change storage element.

2. The integrated circuit according to claim 1, wherein:
the resistance-change storage element is a nonvolatile random access memory cell; and
the thyristor-based storage element is a volatile random access memory cell.

3. An integrated circuit, comprising:
an array of first memory cells; and
each of the first memory cells including a resistance-change storage element and a thyristor-based storage element coupled in series;
wherein the array of memory cells includes:
bitlines coupled to first contacts of the resistance-change storage elements;
second contacts of the resistance-change storage elements coupled to corresponding first emitter regions of the thyristor-based storage elements; and
second emitter regions of the thyristor-based storage elements coupled to a common wordline; and
access wordlines for gating of the thyristor-based storage elements.

4. The integrated circuit according to claim 3, wherein:
the thyristor-based storage elements are p-TCCT cells;
the resistance-change storage elements are phase-change memory cells; and
the common wordline is coupled to ground.

5. The integrated circuit according to claim 3, wherein:
the thyristor-based storage elements are n-TCCT cells;
the resistance-change storage elements are phase-change memory cells; and
the common wordline is coupled to an anodic supply voltage.

6. The integrated circuit according to claim 3, wherein:
the array of first memory cells further includes second memory cells coupled to the access wordlines, the second memory cells for storing indicator bits in association with the first memory cells as associated with the access wordlines; and
the indicator bits indicate whether valid data is stored either in resistance-change storage elements or thyristor-based storage elements for an associated access wordline.

* * * * *